(12) United States Patent
Covington et al.

(10) Patent No.: US 6,798,624 B2
(45) Date of Patent: Sep. 28, 2004

(54) MAGNETIZATION SENSOR FOR SENSING THE WRITE FIELD CHARACTERISTICS OF A PERPENDICULAR OR LONGITUDINAL RECORDING HEAD

(75) Inventors: Mark W. Covington, Pittsburgh, PA (US); Thomas M. Crawford, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 52 days.

(21) Appl. No.: 10/097,280

(22) Filed: Mar. 14, 2002

(65) Prior Publication Data

US 2002/0131214 A1 Sep. 19, 2002

Related U.S. Application Data

(60) Provisional application No. 60/276,283, filed on Mar. 15, 2001.

(51) Int. Cl.[7] .................................................. G11B 5/39
(52) U.S. Cl. .................................. 360/324.1; 360/324.2
(58) Field of Search ................................. 360/317, 318, 360/324.1, 324.2, 125, 126, 324

(56) References Cited

U.S. PATENT DOCUMENTS

| | | | |
|---|---|---|---|
| 5,546,253 A | 8/1996 | Che | 360/324.1 |
| 5,583,727 A | 12/1996 | Parkin | 360/324 |
| 5,585,986 A | 12/1996 | Parkin | 360/324 |
| 5,633,770 A | 5/1997 | Che | 360/324.1 |
| 5,738,938 A | 4/1998 | Kawano et al. | 428/332 |
| 5,750,270 A | 5/1998 | Tang et al. | 428/611 |
| 5,809,637 A | 9/1998 | Rottmayer | 29/603.15 |
| 5,850,326 A | 12/1998 | Takano et al. | 360/122 |
| 5,909,340 A | 6/1999 | Lairson et al. | 360/237.1 |
| 5,976,660 A | 11/1999 | Saito et al. | 428/65.3 |
| 6,029,339 A | 2/2000 | Chang et al. | 29/603.14 |
| 6,104,632 A | 8/2000 | Nishimura | 365/158 |
| 6,111,406 A | 8/2000 | Garfunkel et al. | 324/210 |
| 6,117,282 A | 9/2000 | Kuo et al. | 204/192.2 |
| 6,122,150 A | 9/2000 | Gill | 360/324.11 |
| 6,125,019 A | 9/2000 | Hoshiya et al. | 360/324.1 |
| 6,212,047 B1 | 4/2001 | Payne et al. | 360/318.1 |
| 6,307,707 B1 | 10/2001 | Takano et al. | 360/122 |
| 6,319,622 B1 * | 11/2001 | Shigematsu et al. | 428/692 |
| 6,320,725 B1 | 11/2001 | Payne et al. | 360/125 |
| 6,436,526 B1 * | 8/2002 | Odagawa et al. | 428/332 |
| 6,456,465 B1 * | 9/2002 | Louis et al. | 360/319 |
| 6,469,873 B1 * | 10/2002 | Maruyama et al. | 360/314 |
| 6,567,246 B1 * | 5/2003 | Sakakima et al. | 360/324.11 |
| 6,621,664 B1 * | 9/2003 | Trindade et al. | 360/318 |

OTHER PUBLICATIONS

Weller, et al., *High $K_u$ Materials Approach to 100 Gbits/in$^2$*, IEEE Transaction on Magnetics, vol. 36, No. 1, pp. 10–15 Jan. 2000.

F. B. Mancoff, et al., *A giant magnetoresistance sensor for high magnetic field measurements*, Applied Physics Letters, vol. 77, No. 12, pp. 1879–1881, Sep. 18, 2000.

S. E. Russek, et al., *High–speed characterization of submicrometer giant magnetoresistive devices*, Journal of Applied Physics, vol. 85, No. 8, pp. 4773–4775, Apr. 15, 1999.

S. S. Parkin, et al., *Magnetic tunnel junctions thermally stable to above 300° C.*, Applied Physics Letters, vol. 75, No. 4, pp. 543–545, Jul. 26, 1999.

R. H. Koch, et al., *Magnetization Reversal in Micron–Sized Magnetic Thim Films*, Physical Review Letters, vol. 81, No. 20, pp. 4512–4515, Nov. 16, 1998.

* cited by examiner

*Primary Examiner*—Jefferson Evans
(74) *Attorney, Agent, or Firm*—Buchanan Ingersoll PC; Dennis M. Carleton

(57) ABSTRACT

A magnetization sensor for sensing write field characteristic of a perpendicular or longitudinal recording head such as may be used with a disc drive, and a method of manufacture therefor are disclosed. The sensor can be manufactured concurrently with the write head and incorporated therein. The magnetization sensor comprises a non-magnetic layer separating a hard magnetic layer and a soft magnetic layer, with electrical leads to provide a biasing and sensing current. The magnetization sensor can be either a giant magnetoresistive element or a tunneling magnetoresistive element, depending upon the non-magnetic layer used in the construction of the device.

31 Claims, 6 Drawing Sheets

MAGNETIZATION SENSOR FOR SENSING THE WRITE FIELD CHARACTERISTICS OF A PERPENDICULAR OR LONGITUDINAL RECORDING HEAD

This application is based on and claims benefit of provisional patent application Ser. No. 60/276,283, filed Mar. 15, 2001.

BACKGROUND OF THE INVENTION

1. Technical Field

The present invention is related to recording heads for magnetic recording devices such as a disc drive, and more particularly to an apparatus for sensing write field characteristics for perpendicular and longitudinal recording leads.

2. Description of the Prior Art

The fast-paced evolution to smaller physical features in recording heads is surpassing the capability of traditional wafer metrology, such as tools that measure critical dimension or overlay accuracy, to accurately assess the quality of write heads. Moreover, manufacturers are moving to more performance-based metrics in the evaluation and development of write head technology.

SUMMARY OF INVENTION

It is therefore an aspect of the present invention to provide a way to measure such performance. The above and other objects, features and advantages of the present invention are attained by using a magnetization sensor to measure the write field characteristics of the write head of a disc drive. The sensor comprises a hard magnetic layer and a soft magnetic layer having a non-magnetic layer therebetween. Electrical leads are provided for applying an electrical current bias to the sensor and for obtaining sensor readings.

In a method of manufacturing a write field sensor, a soft underlayer is provided and has a hard magnetic material deposited on a portion thereof. A non-magnetic material is deposited on the hard magnetic material and a soft magnetic material is deposited on the non-magnetic material. Means are also provided for applying a biasing current to the sensor.

The sensor may be fabricated with the write head during the write head build process. Longitudinal write heads are usually built such that the wafer surface is planarized at the write gap. Therefore, the fabrication of the sensor can be performed during this stage of the build process before the rest of the write head build is completed. In addition to the building of the sensor, the write head build process is modified so that an "air bearing surface" plane is defined on the wafer (i.e. the throat height is defined through wafer lithography rather than lapping).

The present invention therefore provides a method to characterize the write field from both perpendicular and longitudinal recording heads by using an on-wafer magnetoresistive sensor utilizing a hard layer with strong perpendicular anisotropy, which has many advantages over prior art methods and devices.

BRIEF DESCRIPTION OF THE DRAWINGS

Various other aspects, features and advantages of the present invention will become readily apparent by reading the following description in conjunction with the drawings, which are shown by way of example only, wherein.

DESCRIPTION OF THE VARIOUS EMBODIMENTS

Figure 1A:
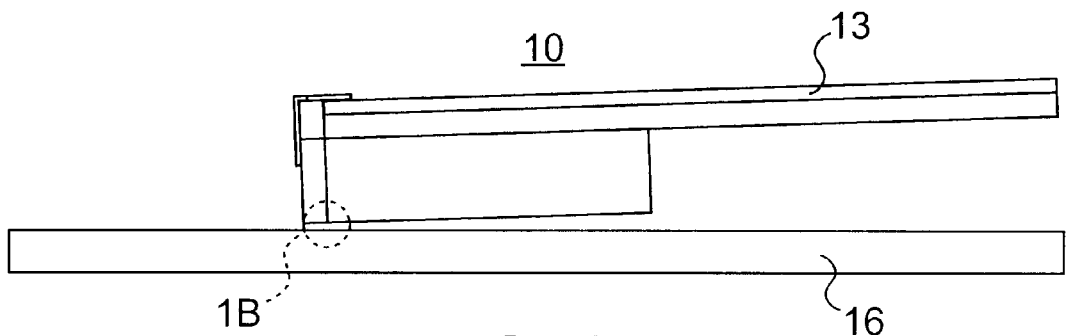
FIG. 1, consisting of FIGS. 1A and 1B, is a schematic representation of a conventional perpendicular write head.
Figure 1B:
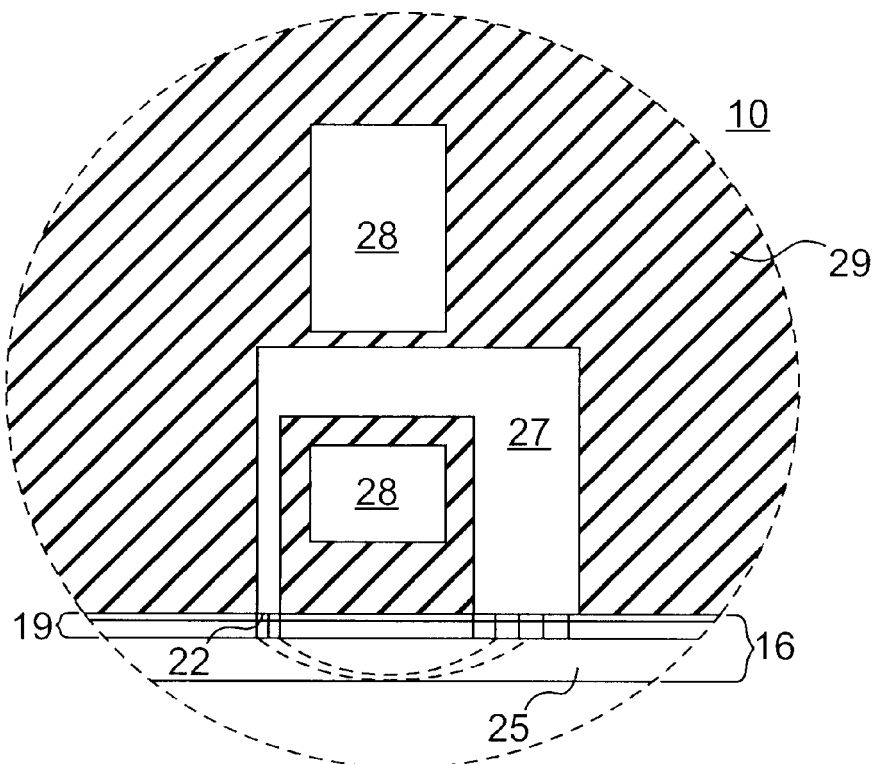

The present invention provides a device and method of manufacture that will measure the spatial and temporal properties of the write field from a recording head. In particular, it is disclosed to measure the write head field with a magnetoresistive sensor. FIG. 1A is a schematic representation of a perpendicular write head, while FIG. 1B is an enlargement of the area circled in FIG. 1A. A recording head 10 is suspended, such as by suspension arm 13, above a recording medium, such as a hard disc 16. The write field 19 is generally confined to a narrow gap between the pole tip 22 on the recording head 10 and a soft ferromagnetic underlayer 25 on the hard disc 16. The present invention is utilized to measure the write field 19 by probing the small region between the recording head 10 and disc 16. As shown in FIG. 1B, a recording head generally includes a ferromagnetic yoke 27 having a coil 28 wound thereon, all of which is surrounded by insulation 29.

Figure 2A:
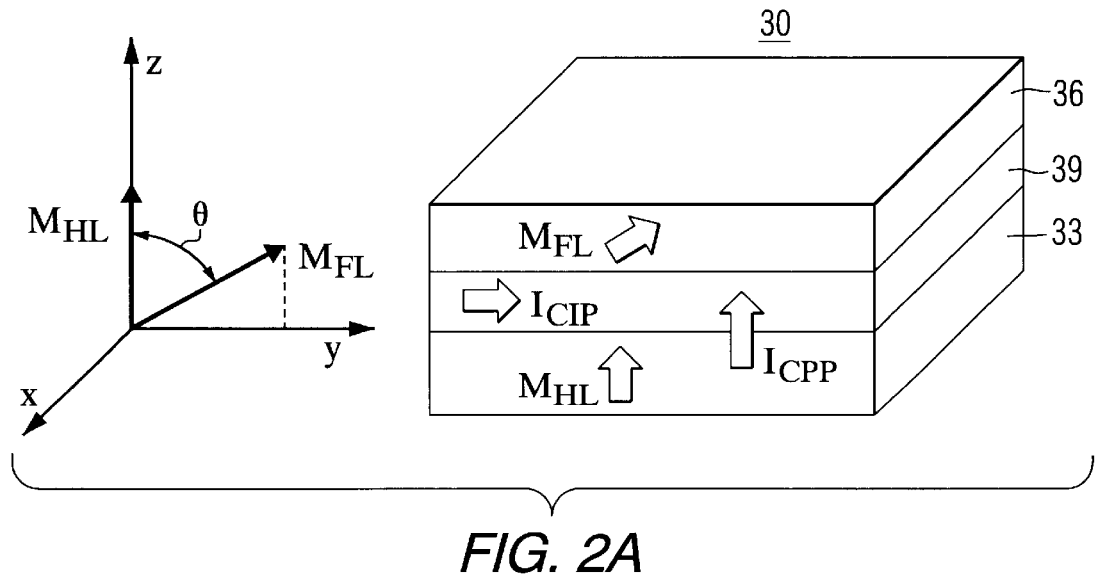
FIG. 2, consisting of FIGS. 2A and 2B, is a schematic representation of a magnetoresistive sensor according to the present invention and a graphical representation of its magnetic proportions.

As shown in FIG. 2, the write field sensor 30 of the present invention is a patterned, multilayer thin film structure comprised of a hard magnetic layer 33, a soft magnetic layer 36, and a non-magnetic spacer 39 separating these two layers. The hard layer (HL) 33 has a strong perpendicular anisotropy, yielding a remanent magnetization oriented perpendicular to the plane of the film. The soft layer 36 acts as the free layer (FL) and has its remanent magnetization oriented parallel to the plane of the film, or having in-plane anisotropy. The non-magnetic spacer 39 decouples the two layers and contributes to an overall giant magnetoresistance (GMR) or tunneling magnetoresistance (TMR) for the sensor 30. FIG. 2A is an example of a magneto resistive sensor. GMR's can also be used for measuring larger magnetic fields up to 20 kG associated with electrical motors, magnetic levitation trains, position sensors or synchrotron insertion devices.

For a GMR, the thickness and material properties of the spacer layer between the hard layer and the free layer preferably should be optimized to produce the largest magnetoresistance. The spacer layer is preferably around 20 angstroms thick. Thicker spacer layers tend to result in lower magnetoresistance, while thinner spacer layers tend to result in higher magnetoresistance, but also allow increased magnetic coupling between the hard and free layers that compromises device performance. There should be little coupling, or interaction, between the hard and free layers. There are generally three preferred material properties for the spacer layer. First, it is preferred that the spacer be a low resistance metal with a long mean free path for the conduction of electrons. Second, there should be minimal spin-flip scattering within the spacer. Third, the spacer should be matched to the free and hard layers such that spin down (up) electrons incident on a non-magnetic/ferromagnetic interface are predominantly scattered over spin up (down) electrons, where up and down refer to the alignment of the conduction electron spin with respect to the magnetization of the ferromagnetic layer. Examples of material combinations that match well are Cu/Co, Ag/Co, Au/Co, and Cr/Fe.

For a TMR, the spacer layer should be a relatively thin, insulator capable of producing a large magnetoresistance. It has been found that a layer of insulator between 10 and 30 angstroms in thickness is optimal for this purpose. The thickness of the barrier can be adjusted to produce an appropriate device resistance, in which the tunnel junction resistance gets lower as the insulating barrier is made thinner. As is the case for the GMR spacer, there should be minimal spin-flip scattering within the insulating tunnel barrier. The insulator is typically, although not necessarily, an oxide. The choice of an oxide is strongly dependent upon the processing requirements, in which it is preferred to use materials or processes that do not oxidize or interdiffuse into the top and bottom ferromagnetic electrodes. Typical fabrication processes deposit a metal and then subsequently oxidize it. Examples of metals that work well as tunnel barriers after appropriate oxidation are Al (Aluminum), Hf (Hafnium), Zr (Zirconium), and Ta (Tantalum).

Figure 2B:
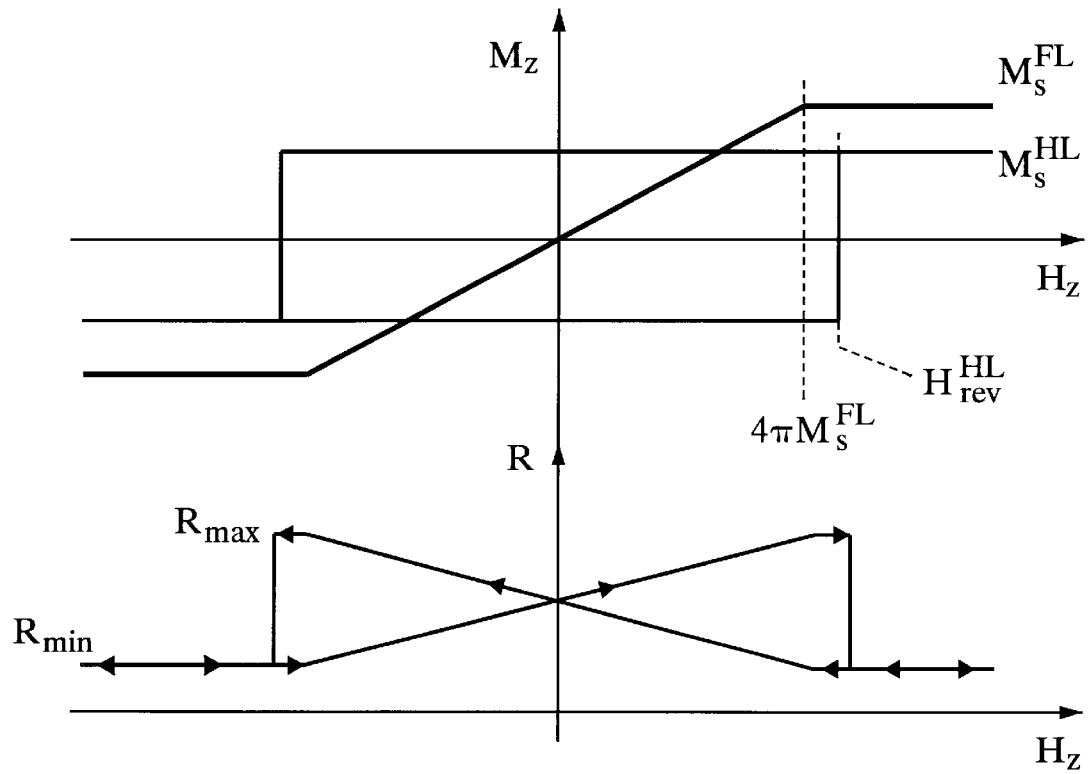

Metallic, non-magnetic leads 40 (FIG. 3A) are attached to the sensor 30 in order to bias the sensor with an electrical current. Depending on the lead geometry, this current will flow either parallel or perpendicular to the plane of the film, hereafter referred to as current-in-the-plane (CIP) or current-perpendicular-in-the-plane (CPP), respectively. GMR devices can be designed for either CIP or CPP biasing while TMR devices are generally CPP devices. FIG. 2B shows magnetization (M) versus perpendicular field (H) for the FL ($M_s^{FL}$) and the HL-($M_s^{HL}$). The bottom curve shows the resulting field dependent resistance.

The resistance of the device is dependent on the relative orientation of the free layer 36 and pinned layer 33 magnetizations and can be expressed as $R(\theta)=R_0-(\Delta R/2)\cos(\theta)$, where $\theta$ is the relative angle between the FL 36 and HL 33 magnetizations, $R_0$ is the resistance when $\theta=\pi/2$, because the HL magnetization is perpendicular to the plane of the film. Application of a magnetic field perpendicular to the plane of the film will rotate the FL 36 magnetization out of the plane and in the direction of the field. The FL 36 magnetization will be fully aligned with the external field for fields exceeding $4\pi M_s^{FL}$, where $M_s^{FL}$ is the saturation moment of the FL 36. The HL 33 will maintain its orientation for perpendicular external fields less than the reversal field, $H_{rev}^{HL}=H_c^{HL}-4\pi N_z M_s^{HL}$, here $H_c^{HL}$ is the HL coercivity, $N_z$ is the demagnetization factor in the direction normal to the film, and $M_s^{HL}$ is the HL saturation moment. The HL 33 will switch its orientation by 180° when a perpendicular field exceeding $H_{rev}$ is applied antiparallel to the magnetization direction.

Figure 3A:
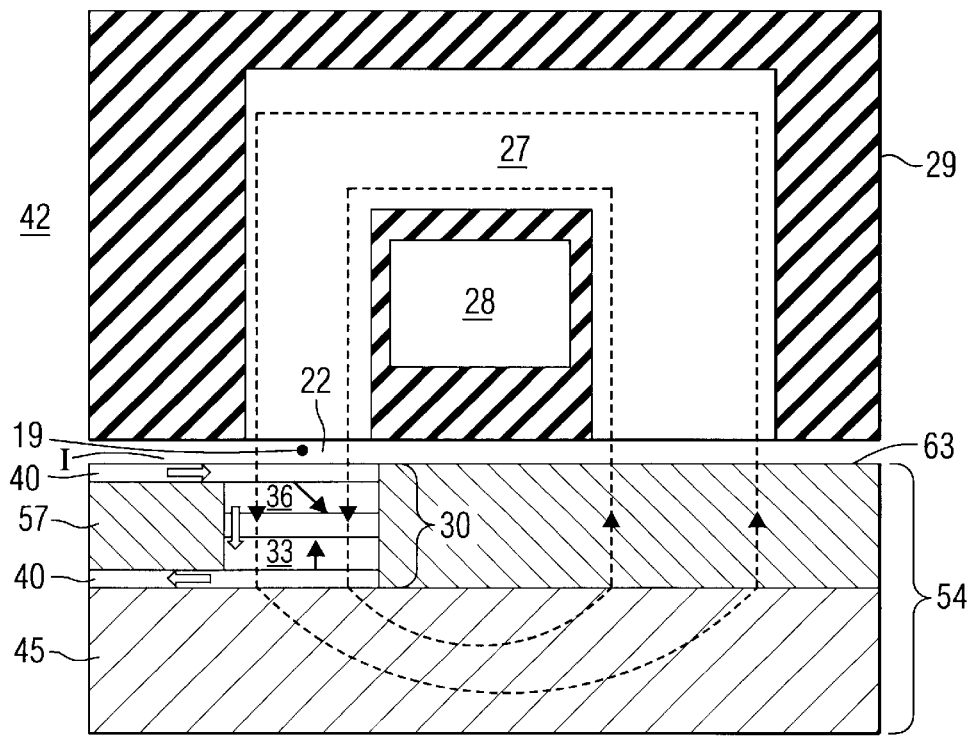
FIG. 3, consisting of FIGS. 3A and 3B, is a schematic representation of a write field measurement sensor for a perpendicular recording head.

For the characterization of the write field from a perpendicular head 42, the sensor 30 can be fabricated on top of a soft underlayer (SUL) 45, as shown in FIG. 3A, in order to replicate perpendicular recording media. The perpendicular recording head 42 is placed in contact with the wafer 54 comprising the sensor 30 and underlayer 45 and scanned around the sensor. The thin film structure of the sensor 30 can be deposited using typical vacuum deposition of the insulating spacer layer 57, and the fabrication of electrical leads 40 built using conventional lithography and wafer processing. Since a recording head 42 will be scanned above the wafer surface 63, it is desired to planarize the top surface to allow free movement of the head. This can be accomplished through chemical mechanical polishing (CMP). The final thickness of the spacer layer 57 material between the SUL 45 and the top surface 63 of the wafer 54 is designed to replicate the combined thickness of the hard layer, overcoat, lube, and air bearing in a magnetic recording system. If CMP cannot provide accurate enough stopping control, an alternative manufacturing process involves terminating the CMP process once the wafer has been planarized and removing the remaining material through a vacuum etch process, which yields much greater stopping accuracy.

Figure 3B:
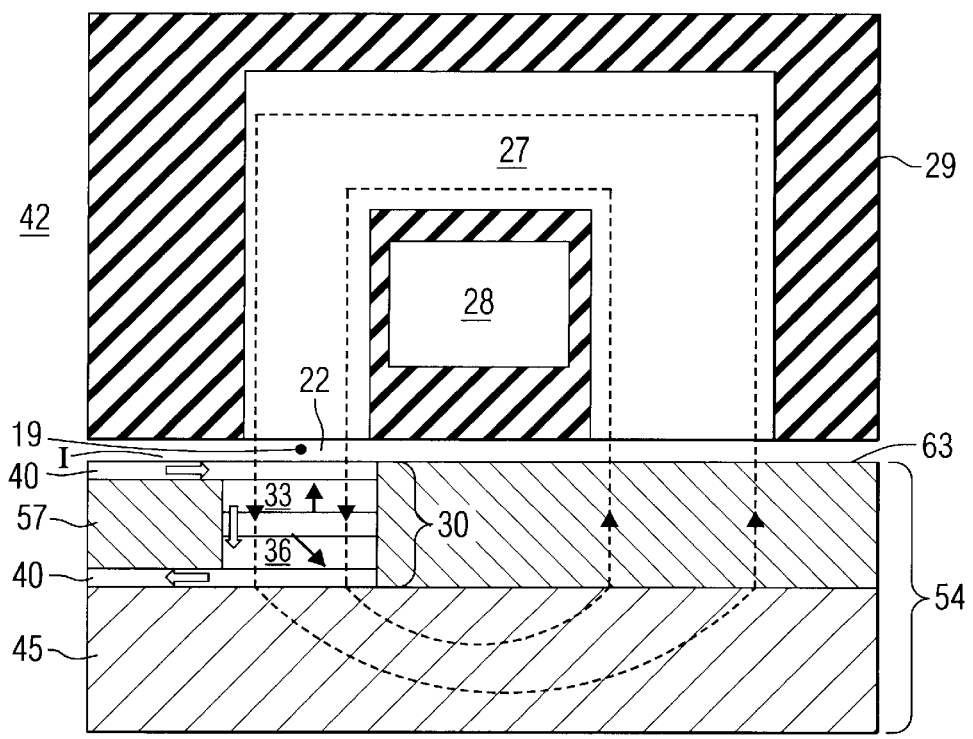

As shown in FIG. 3A, the free layer 36 is deposited on top of the hard layer 33, while in FIG. 3B their ordering is reversed. As will be appreciated by those skilled in the art, these are schematic representations and the different elements are not shown to scale.

Figure 4A:
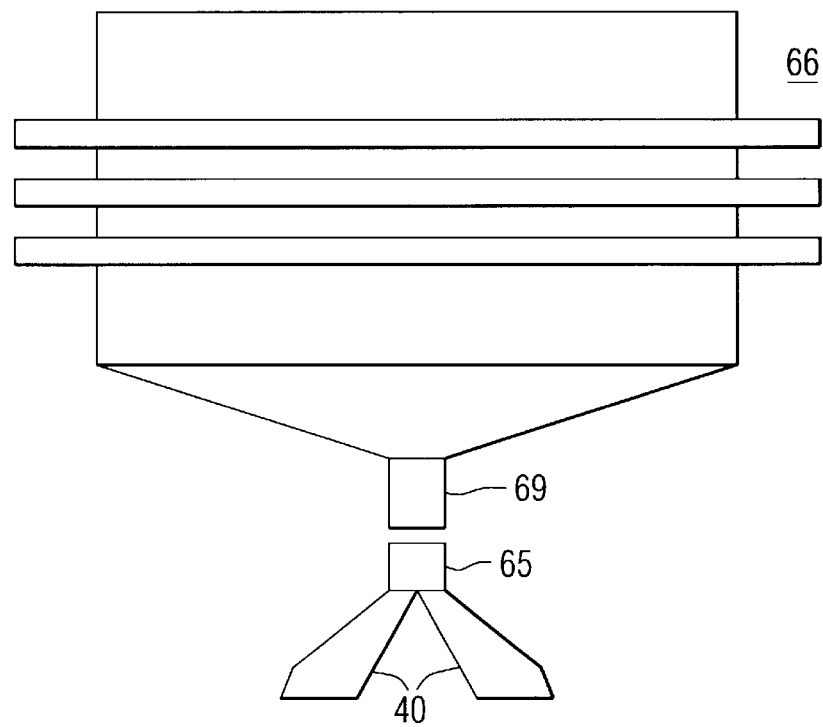
FIG. 4, consisting of FIGS. 4A and 4B, shows top and cross-sectional views, respectively, of a write field measurement sensor for a longitudinal recording head.
Figure 4B:
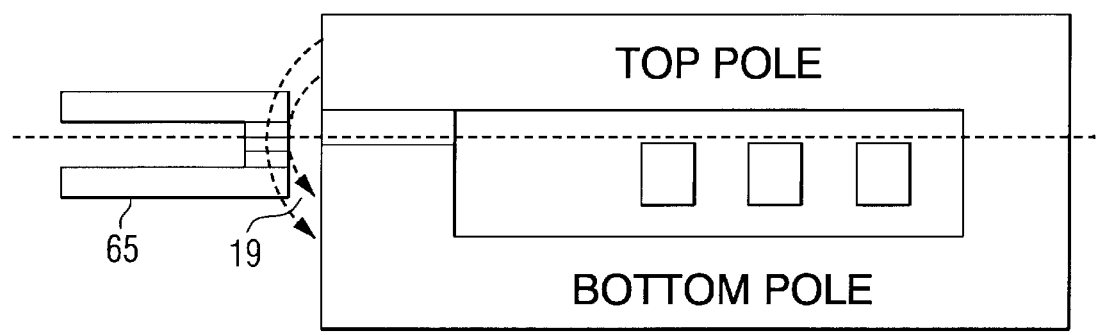

For longitudinal heads, the sensor can be used as an on-wafer probe of the write head, providing performance feedback without having to dice and lap the wafer into individual recording heads. As shown in FIG. 4A, the longitudinal sensor 65 of the present invention is incorporated on-wafer with a longitudinal write head 66. The sensor is incorporated with the write head build process such that it is co-planar with the write gap. FIG. 4A shows a top view of write head 66 and sensor 65. As shown therein, sensor 65 is aligned with write pole tips 69. FIG. 4B is a cross-sectional view with the electrical leads in a CPP configuration.

The general magnetic properties of the device are tailored for the measurement of perpendicular fields greater than 1T. Because one of the advantages of this device is the ability to measure both the amplitude and polarity of the field, it is desirable to use a material with a large perpendicular anisotropy for the HL. Among some of the materials that exhibit coercivities greater than 1T are $L1_0$ phase materials, such as FePt, FePd, and CoPt, or rare earth-transition metal alloys, such as $SmCo_5$. The HL should also satisfy the additional goal of contributing to a large magnetoresistance. As an example, magnetic tunnel junctions based on longitudinal magnetized CoPt (non-$L1_0$ phase) have already been demonstrated to provide adequate magnetoresistance. Lastly, it is desirable for the HL to have a square hysteresis loop (i.e. the remanent magnetization equals the saturation magnetization).

For the FL, the choice of materials is determined again by the write field and the desire for a large magnetoresistance. To measure the full dynamic range of the write head, the saturation moment of the material should be greater than the write field. Alloys of Co and Fe yield large saturation moments and also contribute to a large magnetoresistive response. The application of these materials should yield a device that exhibits a linear response with respect to fields below the FL saturation, as has already been demonstrated with a CIP sensor based on a Co/Pt/Pd multilayer HL and Co/NiFe/Fl.

The principle of operation of this device is based on the assumption that the HL magnetization is fixed in a known direction and the FL magnetization rotates in response to perpendicular fields. For the on-wafer longitudinal writer application, field components in the plane of the sensor are negligibly small and the perpendicular field component dominates. The magnetoresistive response is then a function of the average field across the FL. For the perpendicular writer application, there is the potential for relatively large in-plane fields. An example calculation is shown in FIG. 5.

The effect of the in-plane field is to reduce the amount of out-of-plane rotation of the FL magnetization in comparison to what the angle would be in the presence of the perpendicular field component alone. The amplitude of the in-plane field, $H_{11}$, may become comparable to the perpendicular field $H_1$, however, only for the region outside that directly under the pole tip.

Figure 5A:
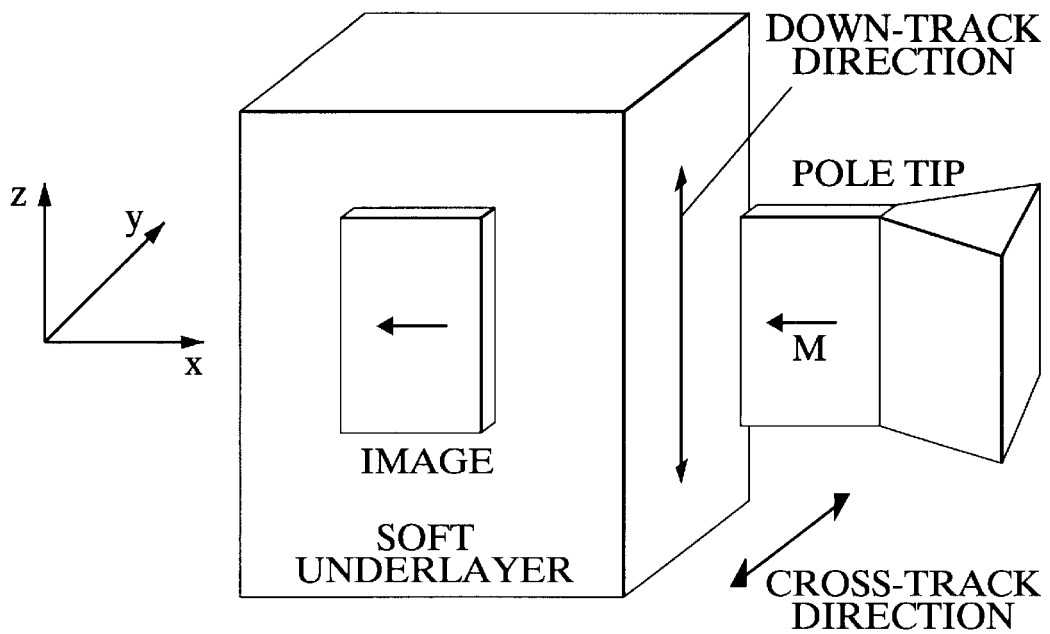
FIG. 5, consisting of FIGS. 5A–5C, is a sample calculation of field components between the pole tip of a writer head and its image in the soft underlayer write field measurement sensor for a perpendicular recording head.
Figure 5B:
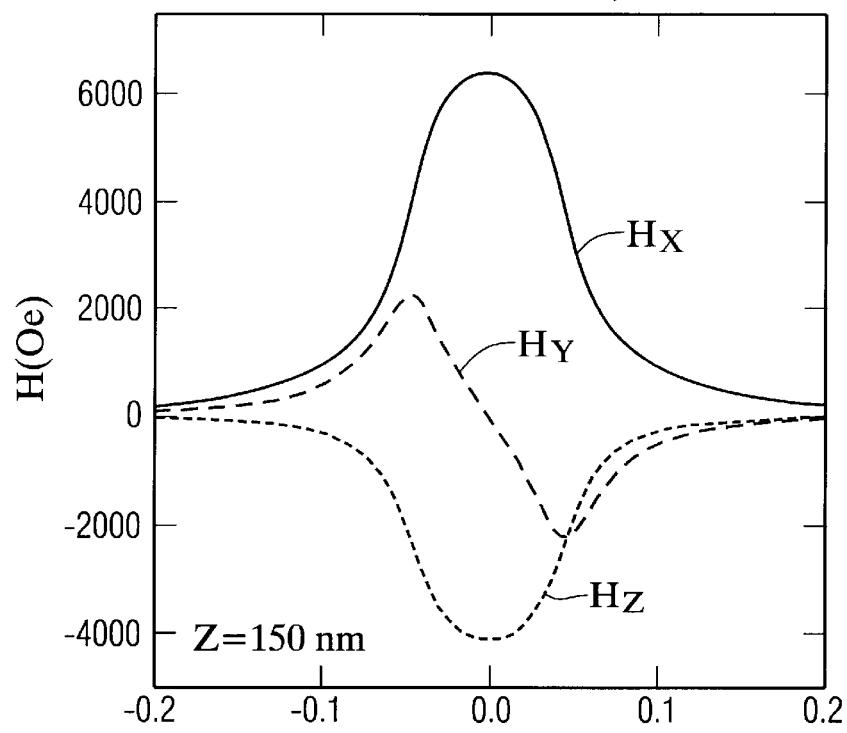
Figure 5C:
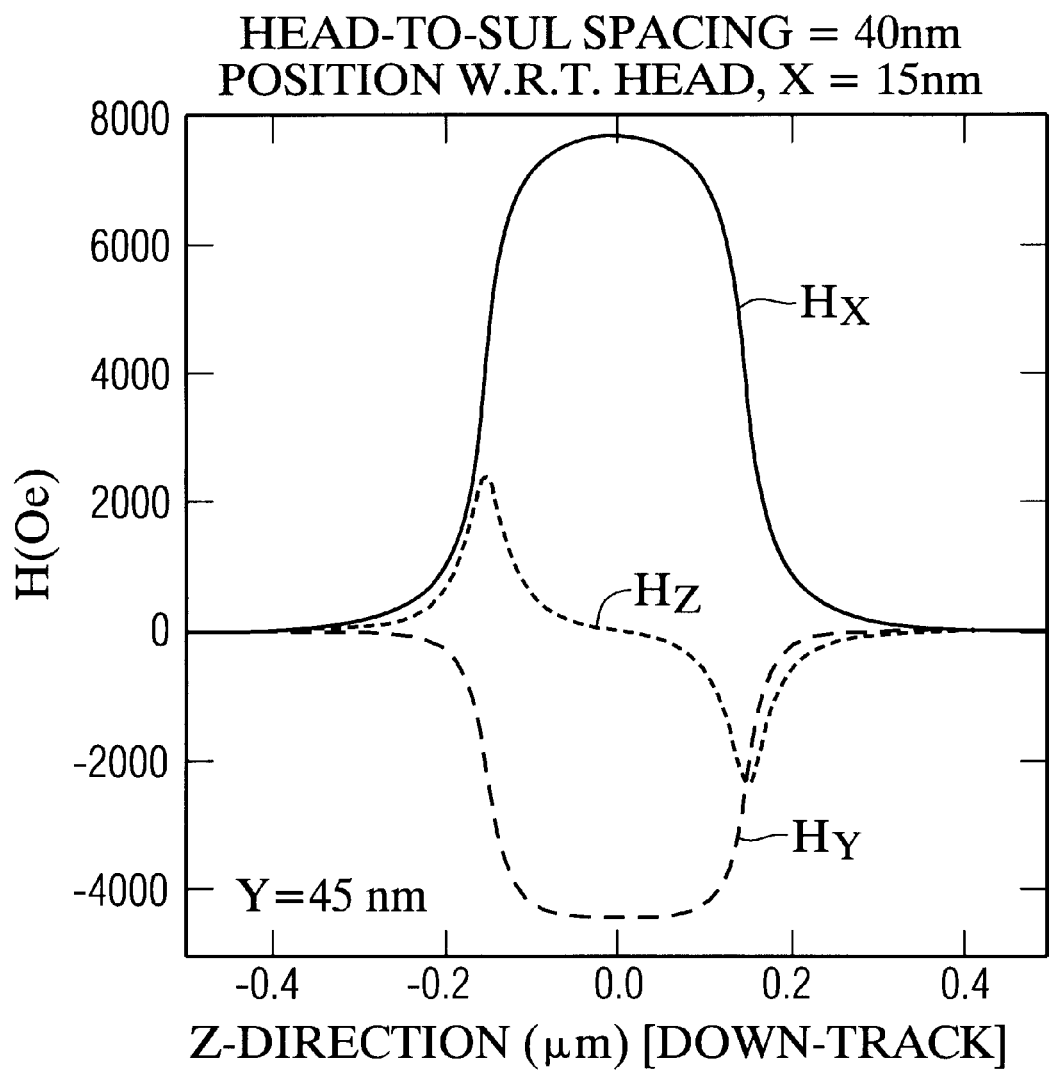

FIG. 5A shows an illustration of the pole tip 70 geometry and the definition of the coordinates. The distance between the write head and the soft underlayer is 40 nm. This example also includes a 90 nm wide pole (in the Y-direction) that is 300 nm thick (in the Z-direction). The calculation assumes a fully saturated pole tip (B=2.2T) that is uniformly magnetized in both the X-direction and the negative X-direction. The origins of the Y-and Z-axes are in the center of the pole tip. In FIG. 5B, the three field components ($H_X$, $H_Y$ and $H_Z$) are shown as a function of position along the cross-track directions. The position is 15 nm below the recording head and directly underneath the center (Y=0) of the trailing edge of the pole tips (Z=150 nm). FIG. 5C is similar to FIG. 5B except that the location is in the middle of the side edge (Z=0, Y=45 nm).

There are some other factors to be considered in the fabrication of the sensor. First, it is desirable to fabricate the sensor so that it is smaller than the physical size of the pole tip such that the magnetoresistive signal will be a direct measure of the write field when the pole tip is directly over the sensor, in which case the write field is almost totally perpendicular. Second, the use of a material for the FL that has a saturation moment that is much larger than the write field can reduce the distortion of the magnetoresistive signal due to in-plane field. Third, it is possible to fabricate sensors with different in-plane anisotropies in which the in-plane components can be indirectly measured. This will allow the possibility of separating out the effects of in-plane and perpendicular field components so that stray fields away from the pole tip can be quantitatively measured. Fourth, in principle, it is possible to exchange the ordering of FL and HL, as shown in FIG. 3, in order to bring the FL closer to the SUL, where the in-plane fields are much smaller relative to the perpendicular field. However, the practical constraints of growing high quality HL materials implies that the FL and non-magnetic interlayer will most likely produce a poor growth template for the HL, in which case the FL will need to be deposited on top of the HL and consequently exposed to large in-plane fields.

Ideally, the magnetoresistive sensor, including the electrical leads, should have a temporal response that is greater than the recording head being characterized. Large bandwidth electrical leads can be achieved by attaching a sensor to an electrical transmission line, as has already been demonstrated using tunnel junctions and GMR spin valves. The magnetic response of the FL can be also tailored for its high frequency response. The ferromagnetic resonance for a thin film in a perpendicular field is equal to $f_{FMR}=\gamma/2\pi(H-4\pi M_s)$ for $H>4\pi M_s$. Thus, it is desirable to use FL material that has a saturation moment much greater than the write field.

Among some of the other advantages of this proposed device is that it can measure the remanent state of the pole tip and the field underneath the flux return pole. Both of these quantities are important for at least two reasons. First, these fields need to be minimized so that the media is not unintentionally erased. Second, the thermal stability of high real density media will be sensitive to the presence of stray fields, including those from the recording head. Finally, write head metrology based on magnetoresistive detection of head fields is an extendable technique that, we believe, will succeed when all other available techniques will either fail or be exceedingly difficult to implement.

While specific embodiments of the invention have been shown in the drawings and described in detail, it will be appreciated by those skilled in the art that various modifications and alternatives would be developed in light of the overall techniques of the disclosure. Accordingly, the particular arrangements disclosed are meant to be illustrative only and not limiting as to the image of the invention which is to be given the full breadth of the appended claims and as any and all equivalents thereof.

We claim:

1. A write field sensor for sensing write field characteristics directly from a perpendicular recording head comprising:
    a soft magnetic underlayer;
    a hard magnetic layer deposited on a portion of said soft magnetic underlayer;
    a non-magnetic material deposited on said hard magnetic layer;
    a soft magnetic layer deposited on said layer of non-magnetic material; and
    means for providing a biasing and sensing current to said write field sensor.

2. The write field sensor of claim 1, wherein said hard magnetic layer is comprised of one of the group consisting of FePt, FePd, CoPt and core earth-transition metal alloys.

3. The write field sensor of claim 1, wherein said hard magnetic layer has a large perpendicular anisotropy.

4. The write field sensor of claim 1, wherein said hard magnetic layer has a square hysteresis loop.

5. The write field sensor of claim 1, wherein said soft magnetic layer has a saturation moment greater than the saturation moment of the write field produced by said perpendicular recording head.

6. The write field sensor of claim 1, wherein said soft magnetic layer is comprised of a Cobalt or Iron alloy.

7. The write field sensor of claim 1, wherein said soft magnetic layer, said non-magnetic layer and said hard magnetic layer forms either a giant magnetoresistive element or a tunneling magnetoresistive element.

8. The write field sensor of claim 7, wherein said non-magnetic layer comprises one or more from the group consisting of copper cobalt alloy, argon cobalt alloy, gold cobalt alloy and chromium iron alloy.

9. The write field sensor of claim 7, wherein said non-magnetic layer comprises one or more from the group consisting of aluminum, hafnium, zirconium and tantalum.

10. The write field sensor of claim 1, wherein said means for providing said biasing current bias provides a current-in-the-plane bias.

11. The write field sensor of claim 1 further comprising a spacer material disposed on the remaining portion of said soft magnetic underlayer.

12. The write field sensor of claim 1, further comprising a layer of hard magnetic material disposed on the remaining portion of said soft magnetic underlayer.

13. A method of manufacturing a write field sensor for sensing write fields characteristics directly from a perpendicular recording head comprising the steps of:
    providing a soft magnetic underlayer;
    depositing a hard magnetic material on a portion of said soft magnetic underlayer;
    depositing a non-magnetic material on said hard magnetic material;
    depositing a soft magnetic material on said non-magnetic material; and providing means for applying a biasing or sensing current to said sensor.

14. A method of manufacturing a write field sensor according to claim 13, further comprising providing a spacer material on a remaining portion of said soft magnetic underlayer.

15. A method of manufacturing a write field sensor according to claim 13, further comprising providing a layer of hard magnetic material on a remaining portion of said soft magnetic underlayer.

16. A method of manufacturing a write field sensor according to claim 13, further comprising providing a soft magnetic material on a remaining portion of said soft magnetic underlayer.

17. A method of manufacturing a write field sensor according to claim 13, further comprising providing a CPP Current to a remaining portion of said soft magnetic underlayer.

18. A method of manufacturing a write field sensor according to claim 13, further comprising providing a CIP Current to a remaining portion of said soft magnetic underlayer.

19. A method of manufacturing a write field sensor for sensing write field characteristics directly from a longitudinal recording head comprising the steps of:

providing a wafer;

forming said longitudinal recoding head on said wafer;

forming a magnetoresistive element on said wafer in close proximity to said write head; and providing means for applying a biasing or sensing current to said magnetoresistive element.

20. The method of claim 19 wherein said step of depositing said magnetoresistive element comprises the steps of:

depositing a layer hard magnetic material on a portion of said wafer;

depositing a layer of non-magnetic material on said layer of hard magnetic material; and depositing a layer of soft magnetic material on said layer of non-magnetic material.

21. The method of claim 19 wherein said magnetoresistive element is selected from a group consisting of a giant magnetoresistive element and a tunneling magnetoresistive element.

22. A combination longitudinal recording head and write field sensor for sensing write field characteristics directly from the longitudinal recording head, comprising:

a wafer;

a longitudinal recording head formed on said wafer;

a magnetoresistive element formed on said wafer in close proximity to said longitudinal recording head; and a means for providing a biasing or sensing current to said magnetoresistive element.

23. The device of claim 22 wherein said magnetoresistive element comprises:

a layer of hard magnetic material;

a layer of non-magnetic material deposited on said layer of hard magnetic material; and a layer of soft magnetic material deposited on said layer of non-magnetic material.

24. The device of claim 23 wherein said magnetoresistive element is selected from a group consisting of a giant magnetoresistive element and a tunneling magnetoresistive element.

25. The device of claim 23, wherein said hard magnetic layer is comprised of one of the group consisting of FePt, FePd, CoPt and core earth-transition metal alloys.

26. The device of claim 23, wherein said hard magnetic layer has a large perpendicular anisotropy.

27. The device of claim 23, wherein said hard magnetic layer has a square hysteresis loop.

28. The device of claim 23, wherein said soft magnetic layer has a saturation moment greater than the saturation moment of the write field produced by said longitudinal recording head.

29. The device of claim 23, wherein said soft magnetic layer is comprised of a cobalt or iron alloy.

30. The device of claim 23, wherein said non-magnetic layer is comprised of one or more materials from the group consisting of copper cobalt alloy, argon cobalt alloy, gold cobalt alloy and chromium iron alloy.

31. The device of claim 23, wherein said non-magnetic layer is comprised of one or more materials from the group consisting of aluminum, hafnium, zirconium and tantalum.

* * * * *

UNITED STATES PATENT AND TRADEMARK OFFICE
CERTIFICATE OF CORRECTION

PATENT NO. : 6,798,624 B2
DATED : September 28, 2004
INVENTOR(S) : Mark W. Covington and Thomas M. Crawford It is certified that error appears in the above-identified patent and that said Letters Patent is hereby corrected as shown below:

Column 6,
Line 50, after "current", delete "bias".
Line 59, change "fields" to -- field --.

Signed and Sealed this

Fourteenth Day of December, 2004

JON W. DUDAS
*Director of the United States Patent and Trademark Office*